US012635477B2

(12) United States Patent
Zinner et al.

(10) Patent No.: US 12,635,477 B2
(45) Date of Patent: May 19, 2026

(54) SUBSTRATE HOLDER WITH CENTRAL ELEVATION AND SUPPORT ELEVATIONS AND METHOD FOR PRODUCING A SUBSTRATE HOLDER FOR BONDING THEREOF

(71) Applicant: EV Group E. Thallner GmbH, St. Florian am Inn (AT)

(72) Inventors: Dominik Zinner, St. Florian am Inn (AT); Thomas Plach, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 353 days.

(21) Appl. No.: 18/031,084

(22) PCT Filed: Feb. 1, 2021

(86) PCT No.: PCT/EP2021/052267
§ 371 (c)(1),
(2) Date: Apr. 10, 2023

(87) PCT Pub. No.: WO2022/161636
PCT Pub. Date: Aug. 4, 2022

(65) Prior Publication Data
US 2023/0369095 A1 Nov. 16, 2023

(51) Int. Cl.
H10P 72/76 (2026.01)
H10P 10/00 (2026.01)
H10P 72/00 (2026.01)

(52) U.S. Cl.
CPC .......... H10P 72/7614 (2026.01); H10P 10/12 (2026.01); H10P 72/0428 (2026.01)

(58) Field of Classification Search
CPC . H01L 21/6875; H01L 21/185; H01L 21/187; H01L 21/67092; H01L 21/2007;
(Continued)

(56) References Cited

U.S. PATENT DOCUMENTS 10,340,161 B2 7/2019 Lindner
10,438,822 B2 10/2019 Lindner
(Continued)

FOREIGN PATENT DOCUMENTS

JP 2005050841 A 2/2005
JP 2018506841 A 3/2018
(Continued)

OTHER PUBLICATIONS

International Search Report from corresponding International Patent Application No. PCT/EP2021/052267, dated Nov. 2, 2021.
(Continued)

*Primary Examiner* — John P. Dulka
(74) *Attorney, Agent, or Firm* — RENNER, OTTO, BOISSELLE & SKLAR, LLP

(57) ABSTRACT

The present invention relates to a substrate holder, a bonding device, a method for producing a substrate holder and a method for bonding. The substrate holder includes a substrate holder surface, a central elevation, and one or more support elevations. The central elevation is arranged on the substrate holder surface with a first mounting surface. The support elevations are respectively arranged on the substrate holder surface with second mounting surfaces. A substrate is arranged on the first mounting surface of the central elevation and on the second mounting surfaces of the one or more support elevations. The first mounting surface is larger than the second mounting surfaces.

10 Claims, 1 Drawing Sheet

(58) Field of Classification Search
CPC .. H10P 72/7614; H10P 10/12; H10P 72/0428; H10P 90/1914
See application file for complete search history.

(56) References Cited

U.S. PATENT DOCUMENTS

| | | | |
|---|---|---|---|
| 10,991,609 B2 | 4/2021 | Zinner et al. | |
| 11,012,008 B2 | 5/2021 | Maeta | |
| 11,282,706 B2 | 3/2022 | Wagenleitner et al. | |
| 11,315,901 B2 | 4/2022 | Zinner et al. | |
| 11,328,939 B2 | 5/2022 | Lindner | |
| 11,955,339 B2 | 4/2024 | Wagenleitner et al. | |
| 12,062,521 B2 | 8/2024 | Lindner | |
| 12,131,907 B2 | 10/2024 | Wagenleitner et al. | |
| 2007/0090479 A1 | 4/2007 | Chen et al. | |
| 2014/0261960 A1 | 9/2014 | Lin et al. | |
| 2014/0356983 A1 | 12/2014 | Lin et al. | |
| 2017/0178931 A1 | 6/2017 | Choi et al. | |
| 2017/0345690 A1 | 11/2017 | Lindner | |
| 2018/0047699 A1* | 2/2018 | Omori | H01L 21/2007 |
| 2019/0019678 A1 | 1/2019 | Wagenleitner et al. | |
| 2019/0189593 A1 | 6/2019 | Kim et al. | |
| 2019/0198362 A1 | 6/2019 | Lindner | |
| 2019/0206711 A1 | 7/2019 | Wimplinger et al. | |
| 2019/0244816 A1 | 8/2019 | Wagenleitner et al. | |
| 2019/0385870 A1 | 12/2019 | Lindner | |
| 2020/0027768 A1 | 1/2020 | Zinner et al. | |
| 2020/0168580 A1 | 5/2020 | Zinner et al. | |
| 2021/0006182 A1 | 1/2021 | Maeta | |
| 2022/0102146 A1 | 3/2022 | Wagenleitner et al. | |
| 2022/0173068 A1 | 6/2022 | Zinner et al. | |
| 2022/0230849 A1 | 7/2022 | Lindner | |
| 2024/0213025 A1 | 6/2024 | Wagenleitner et al. | |

FOREIGN PATENT DOCUMENTS

| | | | |
|---|---|---|---|
| JP | 2019514197 A | 5/2019 | |
| JP | 2020-115593 A | 7/2020 | |
| WO | 2016101992 A1 | 6/2016 | |
| WO | WO-2017/162272 A1 | 9/2017 | |
| WO | WO-2018/028801 A1 | 2/2018 | |
| WO | WO-2019/057286 A1 | 3/2019 | |
| WO | 2020170514 A1 | 8/2020 | |

OTHER PUBLICATIONS

Notification of Grounds for Rejection issued in Japanese Patent Application No. 2023-526353 dated Dec. 5, 2024.
Notice to Comment (Office Action) issued in Korean Patent Application No. 10-2023-7014896 dated Dec. 16, 2024.

* cited by examiner

6''  6'  6                                    3

2

2'

2''

←                                        ↑ A-A

8

7

1

4

8          7              d'      d''          A-A d 2              2'      2''    1 x' x''

5'
5

2        2'      2''  1

SUBSTRATE HOLDER WITH CENTRAL ELEVATION AND SUPPORT ELEVATIONS AND METHOD FOR PRODUCING A SUBSTRATE HOLDER FOR BONDING THEREOF

FIELD OF THE INVENTION

The present invention relates to a substrate holder, a bonding device, a method for producing a substrate holder and a method for bonding substrates, particularly for fusion bonding or hybrid bonding.

BACKGROUND OF THE INVENTION

A wide range of substrate holders exist in the prior art. In particular, in recent years, substrate holders have been constructed, in which a fixed substrate rests not over the whole area, but rather only partially, particularly on elevations. In the prior art, these elevations are sometimes also termed nubs or pins. The word elevation is used in the remainder of the text. These elevations have several different effects. On the one hand, they should minimize rear side contamination of the substrate. Substrates, which do not come into contact with a substrate holder over the whole area, but rather only partially, predominantly have soiling and contamination only at the contact points. A further reason for the use of such substrate holders lies in the possibility of either evacuating the intermediate space of the elevations, in order to provide a fixing element, or flooding the intermediate space with a fluid, particularly a gas, in order to achieve a physical effect.

A few substrate holders delimit different regions, in which such elevations are located, with respect to one another, so that it is possible to speak of segmented substrate holders. The production of such a segment takes place primarily by milling. The elevations are for example milled out of the material. A plurality of such segments can preferably be evacuated individually and/or flushed with a fluid. In particular, a few segments can fix the substrate arranged or placed on the elevations by creating a vacuum. In addition, other segments can be flooded with a fluid, wherein an overpressure is created in the respective segment and the substrate can be bent in a targeted manner. In this case, a convexly bent or outwardly curved substrate can for example advantageously be contacted with a further substrate in a targeted manner in the region of the curvature and therefore be bonded. Contacting can for example take place by allowing a substrate to fall onto a further substrate. What is known as a bond wave propagates, starting from this initial contact point of the two substrates, so that the two substrates are bonded along the bond wave.

One problem in the prior art lies in the fact that during bonding, particularly during fusion bonding, an upper substrate and a lower substrate are distorted, particularly locally, during the progression of the bond wave and thus an inexact bonding result is produced. The error by which the upper substrate is displaced relatively to the lower substrate can be described by a vector. The errors are location-dependent in particular, that is to say the spatial distribution of the errors can be described by a vector field. There are a number of reasons for the local displacements of the two substrates during the bonding process. One reason is the propagation of elastic and continuous waves associated with the bond wave. A further reason is that the upper substrate and the lower substrate are set vibrating after contacting.

In addition, these in particular elastic vibrations also influence the bonding result of the bonded substrate stack made up of the lower and the upper substrate.

In an ideal scenario, an upper substrate would be aligned relatively to a lower substrate and then allowed to fall, so that the bond wave can expand without an elastic wave of the upper and/or lower substrate. However, experiments and calculations have shown that due to allowing the upper substrate to fall and/or due to the contacting of both substrates, the lower substrate, in particular both substrates, start to vibrate. Both substrates or the substrate stack made up of the upper and the lower substrate, which is fusing due to the propagation of the bond wave, are excited. The amplitude of the vibration lies in the sub-micrometre, particularly nanometre range and is difficult to detect. However, errors or distortions that are created as a consequence of these vibrations can be detected.

It is therefore an aim of the present invention to specify a substrate holder, a bonding device, a method for producing a substrate holder and a method for bonding, which overcome at least in part, in particular overcome completely, the disadvantages listed in the prior art. It is in particular an aim of the invention to specify an improved substrate holder, an improved bonding device, a method for producing a substrate holder and a method for bonding. It is furthermore an aim of the present invention to specify a substrate holder, a bonding device, a method for producing a substrate holder and a method for bonding, with the aid of which an improved bonding result can be achieved. In addition, it is an aim of the invention to specify a substrate holder, a bonding device, a method for producing a substrate holder and a method for bonding, with the aid of which local distortions of the substrates, particularly as a consequence of vibrations, created during bonding, of the substrate or of the substrate stack to be bonded, can be reduced and in particular can be prevented.

SUMMARY OF THE INVENTION

The aim is achieved using the features of the coordinate claims. Advantageous developments of the invention are specified in the dependent claims. All combinations of at least two features specified in the description, the claims and/or the drawings also fall within the scope of the invention. When value ranges are given, values lying inside the limits mentioned should also be considered as disclosed as limit values and claimable in any desired combination.

Accordingly, the invention relates to a substrate holder for bonding substrates, particularly for fusion bonding or hybrid bonding, at least having a substrate holder surface, a central elevation arranged on the substrate holder surface, in particular centrally on the substrate holder surface, with a first mounting surface and at least one support elevation arranged on the substrate holder surface with a second mounting surface, wherein a substrate can be arranged on the first mounting surface of the central elevation and on the second mounting surface of the at least one support elevation, and wherein the first mounting surface is larger than the second mounting surface.

It has surprisingly been shown in experiments that a central elevation with a larger first mounting surface than the second mounting surfaces of the at least one support elevation leads to an improved bonding result.

In the following, one of the reasons for a poor bonding result is represented by a mounting surface that is too small. The bond begins at a contact point between the two substrates. Preferably, at least one of the two substrates for the contacting is deformed with the aid of a deforming means. To this end, the deforming means must apply a force to the substrate, which likewise acts on the central elevation. If the central elevation is dimensioned to be too small, a relatively high pressure acts and deforms the central elevation elastically or, in the worst case, even plastically. Due to the deformation of the central elevation, the bond wave cannot be initiated optimally and an error is incorporated already at bond initiation, which in the worst case propagates to the entire bonding result, i.e. over the entire surface. In this case, it has surprisingly been established that the relationship of the central elevation to the other elevations in particular is decisive for the bonding result. If the mounting surface of the central elevation is dimensioned to be correspondingly large, the pressure acting on the central elevation for the same force is smaller. As a result, the central elevation or the substrate is elastically and/or plastically deformed less strongly.

Using the substrate holder according to the invention, the local distortions in the bonded substrate stack in particular can be reduced and the advantages of a substrate holder with elevations, in the case of which the substrate rests only partially, can be used at the same time. Preferably, a substrate arranged on the substrate holder according to the invention is contacted with a further substrate such that the central elevation is flush with an initial contact point. Vibrations arising in the substrate or in the substrate stack during bonding can be reduced particularly effectively by the central elevation or by the first mounting surface.

The substrate, which rests on the substrate holder according to the invention on the first mounting surface and the second mounting surface, can even itself be formed by a, preferably already bonded, substrate stack. The second mounting surface of the at least one support elevation is horizontally flush, preferably with the first mounting surface, so that the substrate can be held particularly level. The central elevation and the at least one support elevation can generally be constructed as desired. Accordingly, the contours of the first mounting surface and the second mounting surface can also be constructed as desired. In this context, mounting surface in particular means an upper part of the respective elevation (central elevation and support elevation) protruding from the substrate holder surface, on which the substrate rests in the arranged state. During bonding, the substrate or the bonding substrate stack is supported by the elevations.

In a preferred embodiment of the invention, it is provided that the substrate holder has at least three, preferably at least four, most preferably at least eight or more support elevations. If the substrate is supported by a plurality of support elevations, the bonding result can advantageously be improved further. In this case, the support elevations have a second mounting surface in each case. In this case, the respective second mounting surfaces of the support elevations are in each case smaller than the first mounting surface of the central elevation. Should the support elevations be adjustable or vertically and/or horizontally movable support elevations, the support behaviour of the substrate holder can additionally be controlled in this manner. An alignment of the respective second mounting surface can advantageously take place by means of a vertical movement of the preferably individually movable support elevations. In this manner, the support elevations can support the substrate in a particularly level manner. In addition, individual support elevations can be removed or arranged so far in the direction of the substrate holder surface or below the same, so that the substrate is not supported by individual support elevations.

In the case of a vertical movability of a support elevation, the exact position of the support of the substrate can advantageously be determined. In this manner, the bond error can advantageously be reduced further, as the positions of the support can be adapted individually to the bonding process by means of the respective support elevations.

In a preferred embodiment of the invention, it is provided that the first mounting surface of the central elevation is at least 1.1-times, preferably at least 1.2-times, more preferably at least 1.5-times, most preferably at least 2-times, most preferably of all at least 3-times larger than the second mounting surface of the at least one support elevation. The first mounting surface of the central elevation can therefore advantageously support the substrate in a larger area.

In a preferred embodiment of the invention, it is provided that the first mounting surface of the central elevation is of circular construction. In this case, the central elevation is preferably likewise of round construction. The circular mounting surface of the central elevation advantageously allows a radially symmetrical support of the substrate in the region of the first mounting surface. Particularly in the case of the bonding of round wafers, a first mounting surface of circular construction may lead to an improved bonding result.

In a preferred embodiment of the invention, it is provided that in each case at least two, preferably at least three, most preferably at least four or more support elevations are arranged at a radial position around a central point of the central elevation. In this case, two or more support elevations can be arranged at a plurality of radial positions in each case. In this case, the central point is the theoretical centre of gravity of the first mounting surface in particular. However, it is also conceivable that the central point is formed by arbitrarily positioned reference point. If the first mounting surface of the central elevation is of circular construction and the central elevation is arranged centrally on the wafer, the central point is flush in the vertical direction, preferably with the central point of the substrate holder surface. In this case, particularly round substrates can advantageously be bonded from the inside outwards. A radial position is therefore defined by a particular distance from the central point or the reference point. At least two support elevations are arranged at this radial position or at the specified distance. In this manner, the substrate can advantageously be supported by the substrate holder during bonding at specified positions at a distance from the central point. Particularly in the case of an excitation of the substrate above the central point or the reference point during bonding, a vibration of the substrate can be absorbed radially symmetrically by the support elevations, particularly at the same time.

In a preferred embodiment of the invention, it is provided that the second mounting surfaces of the respective support elevations arranged at a radial position are constructed identically. In this manner, the substrate at the respective radial position can be supported particularly evenly by the respective support elevations. In particular, with increasing distance from the central point, a vibration of the substrate is not changed differently or is influenced as evenly as possible by the identically constructed support elevations at a radial position.

In a preferred embodiment of the invention, it is provided that the support elevations arranged at a radial position have the same distance from one another along a circle defined by the respective radial position. The circular arc lines between the support elevations along the circle or at the radial position are therefore of the same length. In this manner, the substrate can be supported particularly evenly on the substrate holder by the support elevations.

In a preferred embodiment of the invention, it is provided that, the respective second mounting surfaces of the support elevations of a first radial position are larger than the respective second mounting surfaces of the support elevations of a second radial position, wherein the first radial position has a smaller distance from the central point of the central elevation. The first radial position is therefore closer to the central point or to the reference point. In other words, the size of the respective second mounting surfaces decreases with a larger distance from the central elevation. In this manner, the substrate can be supported particularly effectively. In particular, an overall contact surface or an overall bearing surface can advantageously be kept particularly small.

In a preferred embodiment of the invention, it is provided that at least one radial position, preferably all radial positions are flush with a vibration amplitude of the substrate, preferably a vibration amplitude in the direction of the substrate holder surface of the substrate. In other words, the substrate is supported by the substrate holder only at well defined points at which a maximum deflection of the particular substrate downwards in the direction of the substrate holder surface occurs. For the particular substrate arranged on the substrate holder, the vibration behaviour during bonding is in particular determined in advance or the vibration behaviour is determined on the basis of a bond error of a bonding process carried out previously. It is also conceivable that the vibration behaviour of the substrate stack to be bonded is determined. The support elevations are arranged at the respective vibration amplitudes in the direction of the substrate holder, so that supporting of the substrate can be carried out particularly effectively. In addition, the bonding result is further improved. If the support elevations or the at least one support elevation are horizontally movable, the substrate holder can advantageously be adjusted to the particular substrate or to the bonding process of the substrate stack.

Furthermore, the invention relates to a bonding device for bonding substrates, wherein the bonding device has at least one substrate holder according to the invention. In this case, both substrate holders can also be substrate holders according to the invention. It is decisive in particular in this case that during the bonding, one of the substrates is held or supported by a substrate holder according to the invention. The bonding result can be improved in this manner. Furthermore, the local distortions between two substrates to be bonded can be reduced.

Furthermore, the invention relates to a method for producing a substrate holder for bonding substrates, having at least the following steps:

providing a substrate holder, creating a central elevation with a first mounting surface, creating at least one support elevation with a second mounting surface, wherein the first mounting surface is larger than the second mounting surface. In this manner, the substrate holder produced can advantageously support a substrate on the larger first mounting surface of the central elevation. The creation of the central elevation in step ii) and the at least one support elevation in step iii) can take place in different ways. In this case, the elevations are elevated relative to the substrate holder surface after creation. The central elevation and the at least one support elevation therefore protrude from the substrate holder surface, so that a substrate can be arranged on the first mounting surface and the second mounting surface.

In a preferred embodiment of the invention, it is provided that the method for producing a substrate holder additionally has the following steps:

a) determining a vibration behaviour of a substrate, b) determining positions of the vibration amplitudes in the direction of the substrate holder of the substrate during bonding, wherein the creation of the at least one support elevation in step iii) takes place at one of the positions determined according to step b). In this case, a plurality of support elevations can also take place at a plurality of positions determined in step b). The positions are radial positions in particular. The determination of the vibration behaviour of the substrate in step a) may also comprise the overall vibration behaviour of the substrate stack to be bonded, which is made up of the first substrate, which should be arranged on the substrate holder to be produced, and a further substrate. In this case, the vibration behaviour is preferably determined by means of theoretical elasticity calculations for a particular substrate or the substrate stack to be bonded. The creation of the support elevations at the positions at which the vibration amplitudes occur in the direction of the substrate holder therefore allows an improved support of the substrate or the substrate stack by the substrate stack produced during bonding.

In a preferred embodiment of the invention, it is provided that the method for producing a substrate holder additionally has the following steps:

iv) bonding the substrate with a further substrate to form a substrate stack, v) determining a bond error of the substrate stack, vi) determining positions of the vibration amplitudes of the substrate during bonding on the basis of the bond error, vii) positioning the at least one support elevation at a position determined in step vi).

The positioning in step vii) in this case particularly comprises a renewed arrangement of the support elevations and a renewed creation of the support elevations, if appropriate also on a newly provided substrate holder. The bond error in this case in particular comprises local distortions between the substrate and the further substrate. This bond error can for example be determined as a vector of the dislocation or displacement. The actually occurring vibration behaviour of the substrate or the substrate stack during bonding are determined in particular on this basis. The vibration amplitudes in the direction of the substrate holder, which are determined in this manner, are used as a basis for the positioning of the at least one support elevation or the support elevations. The positions are preferably determined as radial positions. Subsequently, the steps iv) to vii) can optionally be repeated until a desired bonding result is achieved. In this manner, the bonding result can be improved further and the substrate or the substrate stack can be optimally supported during bonding by the substrate holder produced in this manner.

Furthermore, the invention relates to a method for bonding substrates, particularly using a bonding device according to the invention, at least having the following steps:

providing a substrate on a substrate holder according to the invention, providing a further substrate on a further substrate holder, bonding the substrate with the further substrate to form a substrate stack,
wherein the substrate and/or the substrate stack is supported by the first mounting surface of the central elevation during the bonding in step iii).

The substrate is arranged on the substrate holder during the bonding in step iii) and therefore on the first mounting surface of the central elevation and on the second mounting surface/the second mounting surfaces of the at least one support elevation/the support elevations. The larger first mounting surface of the central elevation supports the substrate during the bonding process and therefore also the substrate stack that is forming. In this manner, an improved bonding result can be achieved during the method for bonding.

In a preferred embodiment of the invention, it is provided that during the method for bonding, the first substrate and/or the substrate stack is additionally supported during the bonding in step iii) by the at least one support elevation at a position of a vibration amplitude of the first substrate in the direction of the substrate holder. During the bonding in step iii), the at least one support elevation or the support elevations support the substrate/the substrate stack at a position, at which a maximum deflection in the direction of the substrate holder occurs. Particularly preferably, a plurality of support elevations support the substrate or the substrate stack at every radial position at which a vibration amplitude occurs. The bonding result can be improved further in this manner.

One aspect of the invention includes manufacturing the elevations, that is to say the central elevation and the support elevations, of the substrate holder such that the positions of the elevations on the substrate holder are identically arranged or arranged in the same region as the positions at which the amplitudes of the vibrations of the substrates to be bonded or the resulting substrate stack arise. In this case, the positions of the elevations can initially be calculated for a particular substrate theoretically or the vibration behaviour of the substrate stack is simulated for various positions. Using at least one substrate holder manufactured according to the invention, the substrates are then bonded and the bonding result is subsequently measured. On the basis of the measured distortions or the error vector field, the positions of the elevations can then also be adapted or optimized where necessary, so that the elevations support the resulting substrate stack during bonding only in the region of the amplitudes or the maximum deflections. In this manner, the bonding result can be improved and the local distortions in the substrate stack can at least be reduced.

One advantage is that known designs can be used for the substrate holder and with little outlay, the shape and/or the position of the elevations in a substrate holder can be adapted. Although corresponding substrate holders must be manufactured anew, one achieves better bonding results with these novel substrate holders. In particular, the local distortions can be reduced.

In particular, the idea includes at least one substrate holder being constructed such that the resting substrate is only supported by the elevations at well-defined points. The positions of the elevations are chosen so that the substrate rests precisely at the points or regions on the elevations at which the amplitudes of an elastic deformation of a continuous elastic wave occur. Accordingly, theoretical elasticity calculations and/or measurements of the travelling elastic waves are to be carried out to design such a substrate holder.

A vibration is understood to mean an elastic, particularly time-dependent, distortion of a substrate. The vibration is in particular a solution of a theoretical elasticity differential equation or a differential equation system for, in particular at least partially round, plates, as the substrates may be viewed as being plates.

A wave is understood to mean an elastic, particularly time- and position-dependent, distortion of a substrate. The wave is in particular a solution of a theoretical elasticity differential equation or a differential equation system for, in particular at least partially round, plates. Waves, in contrast to vibrations, are therefore also additionally position-dependent. They are able to propagate spatially, particularly as wave packets.

In the remainder of the text, no further distinction will be made between a vibration and a wave. The phenomena to be compensated during bonding of the substrates to form a substrate stack more likely have a vibration character and do not have a wave character. Vibrations are spoken of exclusively in the remainder of the text for this reason.

The vibrations are damped in particular, that is to say their amplitude decreases as a function of time. In general, the amplitude also decreases as a function of the location, particularly from the centre of the preferably round substrate to the edge.

Zones/Segments

The different zones or segments of the substrate holder are already discussed at length in other published documents. The extension of the substrate holder mentioned here in connection with zones or segments certainly should be disclosed however.

Substrate Holder

Different embodiments of the substrate holder are described in the remainder of the section.

In a first embodiment, the substrate holder has a zone. As no different zones are present, these do not also have to be delimited with respect to one another, and the elevations are individual support points for the substrate. These can particularly preferably be constructed at precisely the points at which the amplitudes of the vibrations, particularly in the direction of the substrate holder, of the substrates arise during the bonding process.

In a second embodiment, the substrate holder is a zone substrate holder. A zone substrate holder is a substrate holder, which has functional regions, which one terms zones. Zones generally have a function, particularly the task of fixing. As the zones can be controlled individually, the fixing can also be controlled individually, particularly in a location-dependent manner.

The substrate holder has at least 2, preferably at least 4, more preferably at least 6, most preferably at least 8, most preferably of all at least 12 zones.

The zones are preferably arranged symmetrically, preferably as circle segments. For a radial coordinate, n zones for example are preferably arranged along identical angular ranges along an angular coordinate line. The zones then have an n-fold symmetry at a radial coordinate along the angular coordinate line. A plurality of angular coordinate lines are possible at different radial coordinates. A zone preferably has a plurality of elevations. Zone substrate holders are for example described in the published documents WO2017162272A1, WO2018028801A1 and WO2019057286A1.

The substrate holder can in principle be produced from any desired material. In particular, the substrate holder includes a plurality of components, which were produced from a plurality of materials. Particularly advantageous however is the use of the following material classes or materials for the components which form the elevations ceramics, particularly
  silicon nitride ($Si_3N_4$)
  silicon carbide
alloys, particularly
  steel
  titanium alloys
metals, particularly
  titanium.

Substrate holders according to the invention made from silicon nitride show particularly good results. Accordingly, the use of silicon nitride as material for the elevations is preferred. Silicon nitride has a modulus of elasticity of approximately 300 GPa. The modulus of elasticity of pure titanium is approximately 105 GPa, the modulus of elasticity of a tool steel is approximately 210-250 GPa. The elevations are preferably produced from a material with the highest possible modulus of elasticity. In particular, materials with a high modulus of elasticity generally also have relatively high hardness values.

Elevations

Elevations protrude from the substrate holder surface and, by means of the first mounting surface and the second mounting surface, form a bearing surface for supporting the substrate and for reducing the local distortions. Therefore, the central elevation and the support elevations are elevations which are arranged at well defined points in order to effect an improved bonding result.

In an embodiment, the elevations are pins, which can be plugged or screwed into prefabricated drill holes or threads. As a result, a change in the position of the elevations is possible in particular.

In a different embodiment, the elevations are switchable elements, particularly piezo elements, which can be brought to a well defined height by a voltage. As a result, a dynamic adaptation of the position of the bearing surfaces of the elevations in particular can be ensured. A level or desirably even mounting of the corresponding substrate can take place in this manner.

In a further embodiment of the substrate holder, further elevations, which fulfil different tasks, are located next to the elevations which are used for the desired effect of supporting the substrate amplitudes. In the remainder of the text, these further elevations are termed additional elevations. The additional elevations can be used for the purpose of further supporting the substrate in the static state, in order thus to prevent or at least to minimize too strong a sagging between the elevations. In particular, the additional elevations have much smaller bearing surfaces or diameters than the elevations. As the additional elevations do not have to absorb the amplitudes of the vibrating substrates, but rather only have a supporting effect, the additional elevations are preferably dimensioned and constructed to be correspondingly narrower. The additional elevations have further bearing surfaces. Together with the bearing surfaces of the elevations, the further bearing surfaces of the additional elevations form an overall mounting surface or an overall support for a substrate that can be arranged on the substrate holder.

According to a preferred embodiment, the additional elevations have less than 1.0-times, preferably less than 0.8-times, more preferably less than 0.5-times, most preferably less than 0.1-times, most preferably of all less than 0.05-times the mounting surface or the diameter of the central elevation.

In a particularly preferred embodiment, the additional elevations are produced from a different material than the elevations. It is for example conceivable that the additional elevations are created from a polymer as part of an insert mat. This insert mat can then simply be installed or inserted into the substrate holder with corresponding recesses for the elevations. The insert mat with the additional elevations is then preferably an injection-moulded part. Polymers advantageously have a particularly low contamination response compared to semiconductor materials.

Production Method

A first exemplary method for producing a substrate holder is described in the following and comprises the following steps in particular.

In a first method step of an exemplary method for producing a substrate holder, the vibration parameters of a predetermined substrate or a substrate stack, particularly the amplitude, is calculated as a function of location and/or time. The calculation takes place analytically, preferably however numerically, particularly using FEM programs. The FEM programs are preferably already integrated in the design software, with the aid of which the substrate holder was also designed. Thus, a theoretical elasticity calculation of the substrate or the substrate stack in relation to the substrate holder to be produced can be realized particularly easily and efficiently. In order to determine the exact vibration behaviour of a substrate, the initial and boundary conditions must be known. These in particular include
  Fixing of the substrate, particularly
    Number of fixing points/fixing surfaces
    Fixing force per fixing point/fixing surface
  Environmental atmosphere, particularly
    The composition thereof
    Temperature
    Density
  Solution means, particularly
    Bond pins, particularly
      Contact pressure of the bond pin
  Nozzles, particularly
    Gas pressure of the nozzle
  Temporal and local processes.

In a second method step of an exemplary method for producing a substrate holder, the substrate holder is produced. In this case, the central elevation, which has a larger mounting surface, is preferably created at a position at which an initial contacting of the substrate, which can be arranged on the substrate holder, with a further substrate should take place. In particular, care is taken that the elevations, particularly the at least one support elevation or the support elevations, are located precisely at the positions at which the amplitudes of the elastic vibration arise during the bonding process, according to the theoretical elasticity calculations.

In an optional third method step of an exemplary method for producing a substrate holder, a bonding process is carried out between two substrates using the substrate holder produced.

In a further, optional fourth method step of an exemplary method for producing a substrate holder, the bond is tested using corresponding metrology systems. In particular, the metrology systems should be able to detect the smallest local distortions. Should the bonding result using the substrate holder produced deliver fewer and/or smaller errors in the bond than using a conventional or reference substrate holder, in which the elevations in particular are not distributed in accordance with the calculations according to the first method step. Should during the investigation, distortions nonetheless be detectable, the positions and/or strengths of the distortions can be used in order to optimize the substrate holder produced, particularly the position and/or the diameter or the size of the mounting surfaces of the elevations. In the ideal case therefore, empirical measurements and (renewed) theoretical elasticity calculations are combined with one another in order to achieve a continuous improvement of a substrate holder that is produced. On this basis, either the substrate holder produced can be adapted or a further substrate holder can be produced, which has the improved arrangement of the elevations, particularly the at least one support elevation, and the optimized dimensions of the bearing surfaces of the elevations, which are determined according to the fourth method step.

The metrology system is preferably an interferometer, more preferably an interferometer which can measure the front and rear sides simultaneously.

Should the measured errors be greater than desired, the data from the measurement are used in order to improve the simulation. Then, the improvement process begins again at the first method step. The production method is preferably carried out multiple times successively for a particular bonding process with substrates to be bonded that are similarly or identically designed.

Bonding Method

An exemplary bonding method with a substrate holder according to the invention in particular is described in the following.

In a first method step of an exemplary bonding method, a first substrate is loaded onto a first, particularly upper, substrate holder.

In a second method step of an exemplary bonding method, a second substrate is loaded onto a second, particularly lower, substrate holder.

It is conceivable that both substrate holders are substrate holders according to the invention. However, the upper substrate is only fixed in order, particularly after bending, to allow it to fall onto the lower substrate in a controlled manner. The vibration is therefore created in particular during the process of contacting the upper substrate with the lower substrate, so that preferably only the lower substrate holder is a substrate holder according to the invention. The vibration initiated by the contacting is damped by the central elevation of the lower substrate holder. In this case, the first mounting surface of the central elevation supports the substrate on a larger surface than the at least one support elevation in the region of the smaller second mounting surface.

In a third method step of an exemplary bonding method, the upper substrate is brought into contact with the lower substrate, particularly in a controlled manner. Controlled means that there is a bending of the upper substrate in particular, in order to contact the lower substrate, particularly in a central and punctiform manner. The contact point is preferably flush with the central elevation. It is also conceivable that the lower substrate holder has means for bending the lower substrate. For the sake of simplicity, it is assumed that the lower substrate is located level on the lower substrate holder according to the invention.

Controlled furthermore means that the upper substrate is released step-by-step, particularly from the centre towards the edge. The formation of an elastic wave in the upper and/or lower substrate is even possible if the upper substrate is still located partially fixed on the upper substrate holder. In particular, each dynamic change of the state of one of the two substrates is connected with the formation of an elastic wave.

In a fourth method step of an exemplary bonding method, the upper substrate is completely detached from the upper substrate holder and left. In particular, starting from this state it is completely subject to the influence of gravity. In this method step, the formation of an elastic wave in the upper and/or lower substrate and thus influencing of the bonding result is maximal. In particular, not only do the individual parts of the substrate parts that are not yet contacted with one another vibrate in the direction of the substrate edge, but rather also the entire, at least already partially bonded, substrate stack.

BRIEF DESCRIPTION OF THE DRAWINGS

Further advantages, features and details of the invention result from the following description of preferred exemplary embodiments, as well as on the basis of the drawings. In the figures.

DETAILED DESCRIPTION OF THE INVENTION

Figures 1A, 1B, 2:
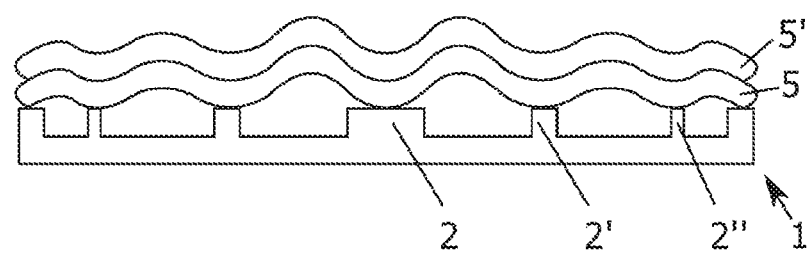
FIG. 1a schematically shows a schematic illustration of an embodiment of a substrate holder according to the invention in a view from above, FIG. 1b schematically shows a schematic illustration of a substrate holder according to the invention according to FIG. 1a in a side view, FIG. 2 schematically shows a schematic illustration of a substrate holder according to the invention in a side view with a vibrating substrate stack.

In the figures, the same components or components with the same function are labelled with the same reference numbers.

Neither the substrate holder nor the elevations (central elevation and support elevations), the substrate stack, the amplitudes or other features are illustrated to the correct scale. In particular, the elevations and above all the amplitudes of the deformed substrates are illustrated many times larger, in order to facilitate the illustration and to improve the understanding for the desired effect of reducing the local distortions.

In particular, only those features of the substrate holder which are used for understanding the invention are illustrated. In particular, the illustration of superfluous features was avoided. An actual substrate holder generally consists of more components.

FIG. 1a shows a plan view of a substrate holder 1 according to the invention. A central elevation can be seen in the form of a central elevation 2, which has a larger central elevation diameter d than the elevations in the form of support elevations 2', 2". It has emerged from empirical measurements that the contact point has the largest distortions and amplitudes during a bonding process of two substrates 5, 5' (not drawn in). In this case, it has surprisingly been shown that a better bonding result can be achieved if the first mounting surface 6 of the central elevation 2 is larger than a second mounting surface 6,6" of a support elevation 2', 2". In the substrate holder 1 illustrated by way of example, the mounting surfaces 6, 6', 6" of the elevations, that is to say the central elevation 2 and the support elevations 2', 2", are round. In this respect, due to the larger central elevation diameter d, the central elevation 2 in each case has a larger first mounting surface 6 than the second mounting surfaces 6', 6" of the support elevations 2', 2" with the support elevation diameters d', d".

A plurality of support elevations 2', 2" are distributed over the substrate holder 1. These were arranged along the substrate holder surface 8 such that vibration maxima that arise, that is to say the amplitudes arise precisely at the positions thereof, when a particular upper substrate 5' is bonded relatively to a particular lower substrate 5, (see FIG.

2). In particular, the position of the substrates 5, 5' is known relative to the substrate holder 1. Only as a result of this can the well defined positions of the support elevations 2', 2'' be determined clearly.

In a less preferred embodiment, a reference 4 is provided, in relation to which a substrate 5, 5' is aligned. In most cases, only the lower substrate 5 is aligned relative to the reference 4, whilst the upper substrate 5' is aligned relative to the lower substrate 5. The reference 4 may for example be a positioning pin, by means of which the position of a notch of a substrate, in particular a wafer, is determined. A surface would also be conceivable, along which a flat side of a substrate, particularly a wafer, is positioned. Furthermore, an alignment mark would be conceivable, in relation to which a substrate 5 is positioned and orientated. Eight symmetrically arranged fixing elements 3 can also be seen. In the simplest case, these are vacuum openings for generating a vacuum between the elevations 2, 2', 2''. The use of different types of fixing elements is likewise conceivable. If this a zone substrate holder, each zone or each segment preferably has at least one fixing element.

Preferably, a reference 4 is dispensed with and the alignment of the lower substrate 5 takes place directly in relation to the elevations 2, 2', 2''. The lower substrate 5 is placed on the substrate holder according to the invention. The upper substrate 5' is positioned relatively to the lower substrate 5 with the aid of an optical alignment system. Thereafter, the upper substrate 5' is brought closer to the lower substrate 5, preferably initially centrally, in that a contacting element (not drawn in), for example a pin or the fluid flow of a nozzle, bends the upper substrate 5'. Contacting processes of this type, particularly for fusion bonds, are known to the person skilled in the art in the field and are not described in more detail here.

FIG. 1b shows a side view of a substrate holder 1 according to the invention with a centrally arranged central elevation 2 and a plurality of support elevations 2', 2''. The elevations 2, 2', 2'' have a diameter d, d', d'' in each case. In this case, the support elevation diameters are constant or the same size along a radial position x', x''. The elevations 2, 2', 2'' can generally also have different shapes (not drawn in here). The central elevation 2, which has a larger first mounting surface, is positioned centrally on the round substrate holder surface in the embodiment illustrated. Starting from the central point 7 of the substrate holder 1 or the central elevation 2, the support elevations 2', 2'' are arranged at a certain radial position x, x''. The support elevations 2, 2'' are distributed symmetrically. The support elevations 2' are in this case arranged at a radial position x' and the support elevations 2'' at a further radial position x'' which is further from the central point 7. The respective second mounting surfaces 6' of the support elevations 2' and the respective second mounting surfaces 6' of the support elevations 2'' are smaller in the illustrated embodiment. In this respect, the size of the mounting surface 6, 6', 6'' of the support elevations decreases outwards and thus with the radial position.

The radial positions x', x'' of the support elevations 2', 2'' are in this case arranged such that the same are flush with a position of a vibration maximum of an elastic vibration, created during bonding, in the direction of the substrate holder. In this manner, the substrate 5 or the substrate stack can be supported during bonding at the amplitudes of the vibration maxima, at which the expected and preferably calculated and measured vibration maxima occur. The exact position and number of the support elevations 2', 2'' is determined in particular by empirical experiments and/or theoretical vibration calculations.

FIG. 2 shows a side view of a substrate holder 1 according to the invention, on which a lower substrate 5 and an upper substrate 5' are bonded to one another. The state directly after the complete contacting of both substrates 5, 5' can be seen. The illustration of an upper substrate holder is omitted. One can see that a vibration process is created on the basis of the bonding process, in particular allowing the upper substrate 5' to fall. The amplitude, which decreases from the centre to the edge in particular, is illustrated in an exaggerated manner. The actual amplitudes lie in the micrometre to nanometre range. However, it can be seen that the amplitudes in the direction of the substrate holder 1 arise at the positions of the elevations 2, 2', 2''. In this case, the largest amplitude arises in the direction of the substrate holder at the position of the central elevation 2 having the larger first mounting surface 6. In this manner, the lower substrate 5 or the substrate stack can advantageously be supported and a local distortion can be minimized. The support elevations 2', 2'' are in this case likewise arranged in the regions at which a maximum deflection of the vibration in the direction of the substrate holder occurs. In this manner, the errors between the first substrate 5 and the second substrate 5' with respect to one another are minimized.

REFERENCE LIST

1 Substrate holder
2 Elevation, central elevation
2', 2'' Elevation, support elevation
3 Fixing element
4 Reference
5, 5' Substrate
x', x'' Radial position
d Diameter, central elevation diameter
d', d'' Diameter, support elevation diameter
6 Mounting surface, first mounting surface (central elevation)
6', 6'' Mounting surface, second mounting surface (support elevation)
7 Central point
8 Substrate holder surface

What is claimed is:

1. A substrate holder for bonding substrates, comprising:
a substrate holder surface;
a central elevation arranged on the substrate holder surface with a first mounting surface; and
one or more support elevations respectively arranged on the substrate holder surface with second mounting surfaces,
wherein a substrate is arranged on the first mounting surface of the central elevation and on the second mounting surfaces of the one or more support elevations,
wherein the first mounting surface is larger than the second mounting surfaces,
wherein the one or more support elevations comprise three or more support elevations,
wherein two or more of the three or more support elevations are respectively arranged at radial positions around a central point of the central elevation,
wherein the radial positions around the central point of the central elevation comprise a first radial position and a second radial position, and
wherein the second mounting surfaces of the support elevations arranged at the first radial position are larger than the second mounting surfaces of the support elevations arranged at the second radial position.

2. The substrate holder according to claim 1, wherein the first mounting surface of the central elevation is at least 1.1-times larger than the second mounting surfaces of the one or more support elevations.

3. The substrate holder according to claim 1, wherein the first mounting surface of the central elevation is of circular construction.

4. The substrate holder according to claim 1, wherein the two or more support elevations respectively arranged at the radial positions around the central point of the central elevation have the same distance from one another along circles respectively defined by the radial positions.

5. The substrate holder according to claim 1, wherein the first radial position has a smaller distance from the central point of the central elevation than the second radial position.

6. The substrate holder according to claim 1, wherein one or more of the radial positions are flush with a vibration amplitude of the substrate.

7. A bonding device for bonding substrates, comprising:
one or more substrate holders for bonding the substrate, each of the substrate holders comprising:
a substrate holder surface,
a central elevation arranged on the substrate holder surface with a first mounting surface, and
one or more support elevations respectively arranged on the substrate holder surface with second mounting surfaces,
wherein a substrate is arranged on the first mounting surface of the central elevation and on the second mounting surfaces of the one or more support elevations,
wherein the first mounting surface is larger than the second mounting surfaces,
wherein the one or more support elevations comprise three or more support elevations,
wherein two or more of the three or more support elevations are respectively arranged at radial positions around a central point of the central elevation,
wherein the radial positions around the central point of the central elevation comprise a first radial position and a second radial position, and
wherein the second mounting surfaces of the support elevations arranged at the first radial position are larger than the second mounting surfaces of the support elevations arranged at the second radial position.

8. A method for producing a substrate holder for bonding substrates, comprising:
providing a substrate holder with a substrate holder surface,
creating a central elevation with a first mounting surface, respectively creating one or more support elevations with second mounting surfaces,
determining a behaviour of a vibration of one of the substrates, and
determining positions of amplitudes of the vibration in a direction of the substrate holder of the one of the substrates during bonding of the substrates,
wherein the first mounting surface is larger than the second mounting surfaces, and
wherein the respectively creating the one or more support elevations takes place at one of the determined positions of the amplitudes of the vibration.

9. The method for producing a substrate holder according to claim 8, further comprising:
determining a bond error of a substrate stack formed by the bonding of the substrates,
determining the positions of the amplitudes of the vibration of the one of the substrates during the bonding of the substrates on the basis of the determined bond error, and
arranging the one or more support elevations at the determined vibration amplitude positions based on the determined bond error.

10. A method for bonding substrates with a bonding device, the bonding device including one or more substrate holders for bonding the substrates, each of the substrate holders including a substrate holder surface, a central elevation arranged on the substrate holder surface with a first mounting surface, and one or more support elevations respectively arranged on the substrate holder surface with second mounting surfaces, the first mounting surface being larger than the second mounting surfaces, the method comprising:
providing one of the substrates on one of the substrate holders,
providing another one of the substrates on another one of the substrate holders, and
bonding the one of the substrates with the other one of the substrates to form a substrate stack,
wherein the substrates and/or the substrate stack is supported by the first mounting surface of the central elevation during the bonding of the one of the substrates with the other one of the substrates, and
wherein the one of the substrates and/or the substrate stack is additionally supported during the bonding of the one of the substrates with the other one of the substrates by the one or more support elevations at a position of a vibration amplitude of the one of the substrates in a direction of the one of the substrate holders.

* * * * *